United States Patent [19]
Grief

[11] Patent Number: 5,166,093
[45] Date of Patent: Nov. 24, 1992

[54] METHOD TO REDUCE THE REFLECTIVITY OF A SEMI-CONDUCTOR METALLIC SURFACE

[75] Inventor: Malcolm Grief, Boise, Id.

[73] Assignee: Micron Technology, Inc., Boise, Id.

[21] Appl. No.: 738,530

[22] Filed: Jul. 31, 1991

[51] Int. Cl.$^5$ .......................................... H01L 21/268
[52] U.S. Cl. .................................... 437/173; 437/228; 437/977; 148/DIG. 138
[58] Field of Search ..................... 437/173, 977, 228; 148/DIG. 138

[56] References Cited

U.S. PATENT DOCUMENTS

| | | | |
|---|---|---|---|
| 3,979,239 | 9/1976 | Walsh | 156/41 |
| 4,082,570 | 4/1978 | House et al. | 437/977 |
| 4,933,304 | 6/1990 | Chen et al. | 437/192 |
| 5,073,518 | 12/1991 | Doan et al. | 437/189 |

OTHER PUBLICATIONS

W. L. C. M. Heyboer et al., "Chemomechanical Si Polishing", *Solid-State Science and Technology, J. Electrochem. Soc.*, vol. 138, No. 3, Mar. 1991, p. 774.

C. Yu et al., "Submicron Al Plug Process Utilizing High Temperature Sputtering and Chemical Mechanical Polishing", Conference Proceedings ULSI-VII, Material Research Soc., 1992.

G. H. Schwuttke et al., "New Gettering Process Using Laser-Induced Damage Plus Internal Oxygen Precipitation," *IBM Tech. Disc. Bull.*, vol. 26, No. 1, Jun. 1983, p. 245.

*Primary Examiner*—Brian E. Hearn
*Assistant Examiner*—Laura M. Holtzman
*Attorney, Agent, or Firm*—Hopkins, French, Crockett, Springer & Hoopes

[57] ABSTRACT

A process for layering a low reflectivity metal layer on a semiconductor wafer for decreasing the optical reflectivity and increasing the optical absorptivity of the metal layer for laser processing. The process includes: depositing a metal layer, such as aluminum, over a substrate, roughening the surface of the metal layer by chemical mechanical planarization (CMP) while injecting a silicon oxide slurry over the surface and then laser processing the metal. The roughened metal surface has an increased surface area and irregular surface features that help absorb incident laser radiation with less reflectance.

9 Claims, 1 Drawing Sheet

METHOD TO REDUCE THE REFLECTIVITY OF A SEMI-CONDUCTOR METALLIC SURFACE

FIELD OF THE INVENTION

This invention relates to semiconductor manufacture and, more particularly, to a method of reducing the optical reflectivity and increasing the optical absorptivity of a metallic surface of a semiconductor wafer.

BACKGROUND OF THE INVENTION

The process of creating a computer chip consists of manufacturing a wafer which then goes through the basic operations of layering, patterning, doping, and heat treatment. This invention discloses a method of layering (i.e., metallization) in preparation for the patterning process.

One of the layers in the layering process consists of a metallic film layer which will eventually later become conductor, or wires between chip elements, e.g., source, drain, and gate in the case of MOS devices. The materials, methods, and processes of "wiring" the component parts together is generally referred to as metallization. The metallization process starts in the masking area where small holes, called contact holes or vias, are etched through all of the surface layers, down to the active regions of the devices. Following contact masking, a thin layer (10,000 to 15,000 Å) of the conducting metal is deposited by vacuum evaporation, sputtering, or chemical vapor deposition (CVD) techniques over the entire wafer.

In the role of surface conductor, a metal must meet the following criteria:
  good electrical currency-carrying capability;
  good adhesion to the top surface of the wafer;
  ease of patterning;
  good electrical contact with the wafer material;
  high purity;
  corrosion resistance; and, finally, in the case of VLSI integrated circuits,
  low reflectivity.

Aluminum or an aluminum alloy is most often used as the metal interconnect in semiconductor manufacture. After deposition, a pulsed laser is generally utilized for further processing the metallic layer, such as to melt and evenly distribute this metallic layer on the substrate. Laser processing may be used, for example, to solidly fill small contact vias on the substrate of an (IC) wafer and to induce the flow of molten metal interconnect into the contact vias. The laser melting of the metal film fills these micron sized windows while preserving various devices located on the (IC) wafer.

In use of laser processing, it often is desirable to apply enough laser energy to heat a metallic layer sufficiently to flow into the vias but not so much as to cause ablation or material loss of the metallic film. Optimal high and low laser energy limits, or a process window, is thus often present. The process of the invention is directed towards widening this process window by lowering the optical reflectivity and increasing the optical absorptivity of a metallic layer during laser processing.

Laser processing of a metallic layer is shown in FIG. 1. With reference to FIG. 1, a semiconductor wafer 12 includes a (Si) substrate 16 having various active regions 14 and an oxide layer (SiO$_2$) 26. A metallic layer 20, such as (Al), is deposited over the oxide layer (SiO$_2$) 26 and into vias 22 for contacting the active regions 14 formed on the wafer substrate (Si) 16. As noted by the dotted lines in the (Al) layer 18, the (Al) layer 18 is initially deposited with poor step coverage over the via 22. The laser processing (i.e., laser reflow) melts and planarizes the (Al) layer 20 so that it completely fills the contact via 22.

During laser processing, a high-intensity laser light beam 10 is directed to the surface 18 of the metallic layer 20 for planarizing and melting the metallic layer 20 to provide a good electrical contact to the active regions 14. The laser beam 10 is ideally directed at a 90° angle to the surface 18. When this ideal situation exists, a minimum of the incident laser beam 10 reflects directly up from the metallic surface 18. In reality, however, some of the incident beam 10 is traveling at angles other than 90° to the metallic surface 18 and is reflected away from the metallic surface 18 as indicated by arrows 24. This reflectivity necessitates higher laser fluences and increased laser process times.

This surface reflectivity of metal layer 20 varies with the material and the surface smoothness of the metallic surface 18. Metal layers, however, especially aluminum and aluminum alloys, have relatively high optical reflectivity properties. A goal of the process of the invention is the formation of a surface to control this form of reflection.

Prior art processes to reduce optical reflectivity on these metal surfaces have included the use of antireflective coatings. Antireflective coatings (ARCs) are generally sputtered onto the wafer metallic surface before laser planarization to reduce optical reflectivity of the laser pulse and, therefore, retain more energy within the metallic layer to improve partial melting. As an example, a prior art ARC deposition may consist of sputtering a 100 Å metallic film such as titanium, a titanium and tungsten alloy, or an amorphous silicon layer on the surface 18 of the metallic layer 20, FIG. 1, prior to the laser processing.

There are several problems associated with the use of an ARC. One is that the additional layer of ARC material requires a separate deposition process, such as sputtering. In addition, the time of laser exposure for the ARC layer can increase 30 to 50 percent, increasing the wafer throughput time. Additionally, some of the ARC material can become alloyed with the metal layer during melting causing an increase in resistivity. Moreover, some ARCs may cause photoresist adhesion problems.

It is therefore, the purpose of the invention to improve the laser reflow process by reducing optical reflectivity and increasing optical absorptivity of a metal layer using a chemical mechanical planarization process. This overcomes the drawbacks associated with the use of prior art ARCs and dyes.

SUMMARY OF THE INVENTION

In accordance with the present invention, a metallization process for forming a low-reflectivity metal layer on a semiconductor wafer is provided. The process simply stated includes the steps of:
  a. depositing a metal layer on a wafer substrate;
  b. roughening the surface of the metal layer by chemical mechanical planarization (CMP), while injecting a polishing slurry on the surface of the metal layer; and then
  c. laser processing the metal layer. The process can be used to increase the optical absorptivity and decrease the optical reflectivity of the metal layer, such that a larger process exposure window for laser reflow of (Al) is provided.

The chemical mechanical planarization step of the process must be accurately controlled to provide a roughened surface for achieving a lower reflectivity. Accordingly, process parameters must be adjusted, such that the surface is roughened but not polished.

Other objects, advantages, and capabilities of the present invention will become more apparent as the description proceeds.

DETAILED DESCRIPTION OF THE INVENTION

Figure 2:
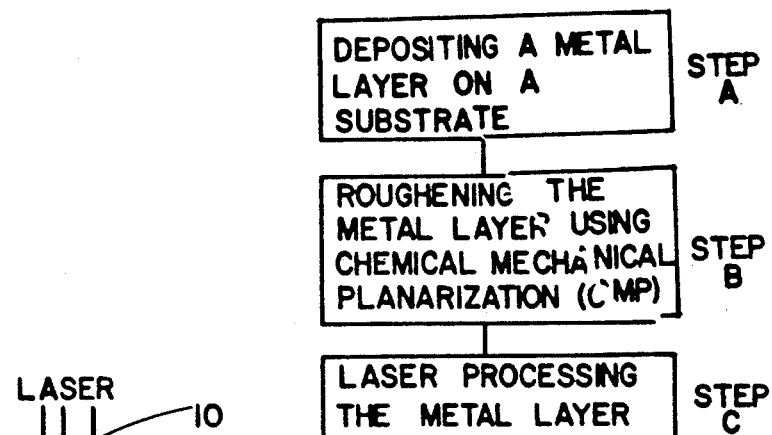
FIG. 2 is a flow diagram of the process of the invention.
Figure 1:
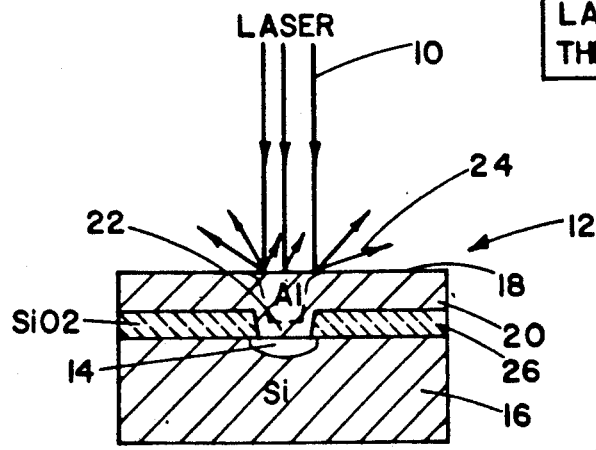
FIG. 1 is a side-section view of a semiconductor during laser processing (prior art)

Referring now to FIG. 2, a process for reducing the optical reflectivity and increasing the optical absorptivity of a semiconductor metallic surface is shown. The process includes the steps of:

depositing a metal layer on a substrate, step A;

roughening the surface of the metal layer using chemical mechanical planarization while injecting a polishing slurry on the metal layer, step B; and then laser processing the metal layer, step C.

In an illustrative embodiment of the invention, the metal layer may be Al or an Al alloy, such as AlSiCu, deposited upon a silicon substrate. Other alloys of aluminum with silicon, copper, and titanium may also be used. Alternately, other metal film layers or substrates may also be utilized for the practice of the invention. The metal layer may be deposited by sputtering, chemical vapor deposition (CVD), electron beam deposition, or other deposition processes that are known in the art.

The deposited metal layer is next roughened using chemical mechanical planarization (CMP). In general, chemical mechanical planarization involves holding or rotating a thin, flat wafer of semiconductor material against a wetted polishing surface under controlled chemical, pressure, and temperature conditions. A chemical slurry containing a polishing agent such as alumina ($Al_2O_3$) or silica ($SiO_2$) is utilized as the abrasive medium. Additionally, the chemical slurry may contain chemical etches for etching various surfaces of the wafer.

In general, a semiconductor wafer is subjected to chemical mechanical planarization to remove topography, layers of material, surface defects such as crystal lattice damage, scratches, roughness, or embedded particles of dirt or dust. With the present process, (CMP) is utilized to roughen rather than polish a metallic surface of the wafer.

In the chemical mechanical planarization (CMP) process, a rotating polishing head is typically utilized to hold the wafer under controlled pressure against a rotating polishing platen. The polishing platen is typically covered with a relatively soft, wetted material such as blown polyurethane or a pad material, such as Polytex Supreme ™ from Rodel. The chemical slurry is metered onto the polishing platen and is selected to provide a mildly abrasive medium and chemical activity for the etching.

Such apparatus for polishing thin, flat semiconductor wafers are well known in the art. U.S. Pat. Nos. 4,193,226 and 4,811,522 to Gill, Jr. and U.S. Pat. No. 3,841,031 to Walsh, for instance, disclose such apparatus. Another such apparatus is manufactured by Westech Engineering and designated as a Model 372 Polisher.

With the process of the invention, the metal layer is roughened by the (CMP) but is not polished. It is believed that roughening a metallic surface increases the optical absorptivity and decreases the optical reflectivity of the surface by two mechanisms:

1. some of the laser light is scattered by hillocks formed on the roughened surface and is reabsorbed by adjacent surface irregularities;

2. the total surface area of the metallic layer will increase giving rise to an increase in the amount of laser light absorbed by the surface.

It is critical to the process of the invention that the chemical mechanical planarization (CMP) process be accurately controlled to achieve a desired roughness. Among the most critical process parameters are the composition of the polishing slurry, the length of time of planarization, and the amount of surface metal removed.

As an example, the polishing slurry may contain silicon dioxide ($SiO_2$), water, and an acid buffer to reduce the pH to about 5.5. By utilizing a polishing slurry containing ($SiO_2$), the roughening effect may be enhanced by deposition of a very thin layer of ($SiO_2$) on the metallic surface, i.e., about 200 to 500 Å.

Test data indicate that the (CMP) step should be for a relatively short time, on the order of about 10 to 40 seconds, depending on process conditions. Less than 10 seconds removes too little material and does not appreciably reduce the reflectivity. Continuing the (CMP) beyond 40 seconds causes too much aluminum material to be removed, polishing the surface and increasing the reflectivity. A preferred CMP time period of from about 10 to 40 seconds and using a polishing slurry as previously described at a pH of 5.5 removes on the order of about 500 Å of metal from the surface of the substrate. This reduces reflectivity of the surface on the order of 50%.

Following roughening by chemical mechanical planarization (CMP), the metal layer may be laser processed. The resultant metal layer has a reflectivity of less than half of a normally sputter deposited film, which is generally less than can be achieved with prior art sputtered ARC layers.

Figure 3:
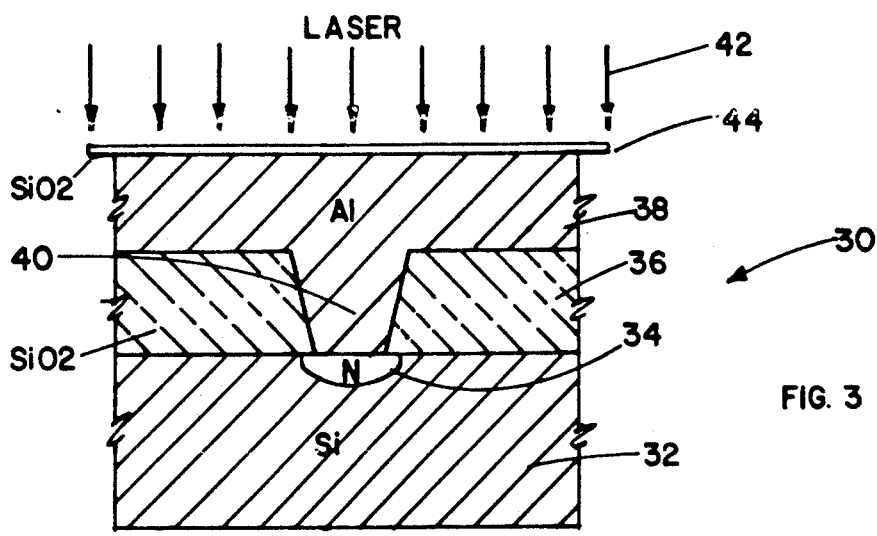
FIG. 3 is a side section view of a semiconductor processed in accordance with the invention during laser processing.

Referring now to FIG. 3, the layers of materials as developed in the process of the invention are illustrated on a silicon wafer 30. The silicon wafer 30 includes a (Si) substrate 32 formed with a plurality of active N-doped regions 34 and with a silicon oxide layer 36 formed above the active regions 34. A layer of aluminum interconnect 38 has been sputtered over the substrate 32 and oxide layer 36. Sputtering is often a preferred process over other vapor deposition systems because it provides better control of film characteristics by balancing the sputtering parameters of pressure, temperature, deposition rate, and target material(s). Multiple layers may be sputtered in one process by the use of multiple target arrangements.

A plurality of contact vias 40 are formed through the oxide ($SiO_2$) layer 36 for contact with active N-doped regions 34 of the substrate 32. It is the function of laser beam 42 in the laser processing (step C) to melt and planarize the aluminum interconnect layer 38 to fill the vias 40 and make good electrical contact with active region 34. During the chemical mechanical planarization (CMP), a thin layer of (SiO$_2$) 44 is formed upon the aluminum layer 38 by deposition of the polishing slurry (i.e., SiO$_2$, water, acid buffer). A thickness of the (SiO$_2$) layer will be on the order of about 200 to 500 Å. The abrasive (SiO$_2$) will roughen and remove (Al) material from the surface of the aluminum 38. A thickness of removed Al material from aluminum layer 38 will be on the order of about 500 Å. Removal of this amount of material will provide a metal surface that is roughened but not completely polished. Surface reflectivity of the metal layer 38 will thus be decreased by the mechanisms previously described (i.e., light reabsorption by surface irregularities, increased surface area).

The chemical mechanical planarization (CMP) process initially roughens the surface of the metal layer 38 and decreases the reflectivity of the surface. If the (CMP) process proceeds past a certain point, however, the surface becomes polished and reflectivity once again increases. The (CMP) process must, therefore, be accurately controlled to achieve a desired surface roughness.

Data has shown that the reflectivity reduction for a roughened metal surface is on the order of 50% or greater. Measurement is based on exposing a bare silicon wafer surface to 480 nm light while measuring the reflected light and calling this 100% reflectance. The reflectance of a titanium ARC process will typically be about 60%, and the reflectance of this (CMP) process of the invention gives a reflectance of 30% while removing 500 Å of aluminum.

Thus, the invention provides a simple but unobvious method for decreasing the optical reflectivity and increasing the optical absorptivity of a metal layer in a semiconductor manufacturing process. This process can be used to provide a larger process exposure window for a subsequent laser photolithographic process.

While only one embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A semiconductor manufacturing process comprising:
   a. depositing a metal layer over a substrate;
   b. roughening a surface of the metal layer using chemical mechanical planarization (CMP) for a period of about 10 to 40 seconds using a polishing slurry of silicon dioxide and an acid buffer at a pH of about 5.5, thereby forming a thin silicon oxide layer of about 200 to 500 Å on the metal layer to decrease a reflectivity and increase an absorptivity of the metal layer; and then.
   c. laser processing the metal layer.

2. In the manufacture of a semiconductor integrated circuit, a low reflectivity metallization process that adds a layer of metal over a wafer substrate comprising the steps of:
   a. depositing a layer of metal over the substrate;
   b. roughening a surface of the metal layer using chemical mechanical planarization (CMP) for a period of about 10 to 40 seconds while injecting a polishing slurry containing SiO$_2$ and an acid buffer at a pH of about 5.5, thereby forming a silicon dioxide layer of about 200 to 500 Å on the metal layer; and then
   c. laser processing the metal layer.

3. In the manufacture of a semiconductor integrated circuit, a low reflectivity metallization process that adds a layer of aluminum over a wafer substrate comprising the steps of:
   a. sputtering a layer of aluminum interconnect over the substrate;
   b. roughening a surface of the aluminum using chemical mechanical planarization (CMP) while injecting a polishing slurry containing silica on the surface to create a thin silicon oxide layer;
   c. stopping the CMP process after removal of about 500 Å of aluminum; and then
   d. laser processing the aluminum to melt the aluminum and fill contact vias formed in the substrate.

4. The metallization process of claim 3 and wherein: the thin silicon oxide layer is about 200 to 500 Å in thickness.

5. The metallization process of claim 3 and wherein: the wafer CMP process is performed for a period of about 10 to 40 seconds.

6. The metallization process of claim 5 and wherein: the slurry includes an acid buffer and has a pH of about 5.5.

7. In the manufacture of a semiconductor integrated circuit, a low reflectivity metallization process that adds a layer of aluminum alloy over a wafer substrate comprising the steps of:
   a. sputtering a layer of aluminum alloy interconnect over the substrate;
   b. roughening an aluminum alloy surface using chemical mechanical planarization (CMP) process while injecting a polishing slurry containing silica on the aluminum alloy surface to create a silicon oxide layer of about 200 to 500 Å:
   c. stopping the CMP process after a period of from about 10 to 40 seconds; and
   d. laser melting the aluminum alloy layer to fill contact vias to the substrate.

8. The metallization process of claim 7 and wherein: the (CMP) process removes less than 500 Å of aluminum alloy.

9. The metallization process of claim 8 and wherein: the aluminum alloy is aluminum alloyed with a metal selected from the group consisting of silicon, copper, and titanium.

* * * * *